United States Patent
Wu et al.

(10) Patent No.: US 10,748,637 B2
(45) Date of Patent: Aug. 18, 2020

(54) SYSTEM AND METHOD FOR TESTING PROCESSOR ERRORS

(71) Applicant: International Business Machines Corporation, Armonk, NY (US)

(72) Inventors: Nelson Wu, Austin, TX (US); Manoj Dusanapudi, Bangalore (IN); Shakti Kapoor, Austin, TX (US); Nandhini Rajaiah, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 16/046,163

(22) Filed: Jul. 26, 2018

(65) Prior Publication Data

US 2020/0035319 A1    Jan. 30, 2020

(51) Int. Cl.
*G11C 29/38* (2006.01)
*G06F 9/30* (2018.01)

(52) U.S. Cl.
CPC .......... *G11C 29/38* (2013.01); *G06F 9/30043* (2013.01); *G06F 9/30098* (2013.01)

(58) Field of Classification Search
CPC .................................................... G11C 29/38
USPC ................................ 714/718, 723, 719, 722
See application file for complete search history.

(56) References Cited

U.S. PATENT DOCUMENTS

| | | | |
|---|---|---|---|
| 5,835,925 A * | 11/1998 | Kessler | G06F 9/3004 711/2 |
| 7,370,243 B1 | 5/2008 | Grohoski et al. | |
| 7,739,570 B2 | 6/2010 | Bag et al. | |
| 8,788,794 B2 | 7/2014 | Serebrin et al. | |
| 9,122,476 B2 | 9/2015 | Serebrin et al. | |
| 9,140,753 B2 | 9/2015 | Hopkins et al. | |
| 9,188,638 B2 * | 11/2015 | Hopkins | G01R 31/31705 |
| 2008/0104369 A1 * | 5/2008 | Reed | G06F 12/0802 712/28 |
| 2010/0146220 A1 * | 6/2010 | Panchenko | G06F 11/3471 711/154 |
| 2015/0061711 A1 * | 3/2015 | Hamilton | G01R 31/2855 324/750.05 |
| 2016/0224452 A1 | 8/2016 | Park et al. | |
| 2018/0239909 A1 * | 8/2018 | Tsirkin | G06F 9/45558 |
| 2019/0198132 A1 * | 6/2019 | Dusanapudi | G11C 29/38 |

* cited by examiner

*Primary Examiner* — Fritz Alphonse
(74) *Attorney, Agent, or Firm* — Scully, Scott, Murphy & Presser, P.C.

(57) ABSTRACT

A system comprising a computer processor comprising a plurality of registers, a load-store unit configured to load data in at least one of the plurality of registers, and a memory. The memory includes a memory location mapped to a first virtual memory address and a second virtual memory address. Issuance of a load from the memory location via the first virtual memory address causes execution of a side effect. The memory also includes a computer program containing programming instructions that, when executed by the computer processor, performs an operation that includes storing a predetermined data value at the memory location, and testing the memory for errors during load operations.

20 Claims, 4 Drawing Sheets

SYSTEM AND METHOD FOR TESTING PROCESSOR ERRORS

BACKGROUND

The present invention relates generally to the field of data processing systems, and more specifically to a method, system, and computer program product for testing a memory system. Still more particularly, the present invention relates to a method, system, and computer program product for, and in particular to validation of processor memory operations (i.e., load operations for copying data from main memory to a processor register).

Ensuring the integrity of data processed by a data processing system such as a computer or like electronic device is critical for the reliable operation of such a system. Data integrity is of particular concern, for example, in fault tolerant applications such as servers, databases, scientific computers, and the like, where any errors whatsoever could jeopardize the accuracy of complex operations and/or cause system crashes that affect large numbers of users.

Data integrity issues are a concern, for example, for many solid state memory arrays such as those used as the main working storage repository for a data processing system. Solid state memory arrays are typically implemented using multiple integrated circuit memory devices such as static or dynamic random access memory (SRAM or DRAM) devices, and are controlled via memory controllers typically disposed on separate integrated circuit devices and coupled thereto via a memory bus. Solid state memory arrays may also be used in embedded applications, e.g., as cache memories or buffers on logic circuitry such as a processor chip.

A significant amount of effort has been directed toward detecting and correcting errors in memory devices during power up of a data processing system, as well as during the normal operation of such a system. It is desirable, for example, to enable a data processing system to, whenever possible, detect and correct any errors automatically, without requiring a system administrator or other user to manually perform any repairs. It is also desirable for any such corrections to be performed in such a fashion that the system remains up and running. Often such characteristics are expensive and only available on complex, high performance data processing systems. Furthermore, in many instances, many types of errors go beyond the ability of a conventional system to do anything other than "crash" and require a physical repair before normal device operation can be restored.

Conventional error detection and correction mechanisms for solid state memory devices typically rely on parity bits or checksums to detect inconsistencies in data as it is retrieved from memory. Furthermore, through the use of Error Correcting Codes (ECC's) or other correction algorithms, it is possible to correct some errors, e.g., single-bit errors up to single-device errors, and recreate the proper data.

Despite the advances made in terms of error detection and correction, however, one significant limitation of the aforementioned techniques is that such techniques are not configured to directly verify, immediately after a load operation, whether correct data is stored in a register as a result of that operation. A memory load operation reads a datum from memory, loads it in a processor register, and frequently starts a sequence of operations that depend on the datum loaded. Incorrect data may be written to the processor register if, for example, the processor executes the load operation at the same memory location more than once for the same data value and data at the memory location is not flushed, improperly flushed, overwritten, and/or erroneously modified between the load operations.

SUMMARY OF THE INVENTION

The summary of the disclosure is given to aid understanding of the computer processing systems and methods of detecting errors in processor memory load operations, and not with an intent to limit the disclosure or the invention. The present disclosure is directed to a person of ordinary skill in the art. It should be understood that various aspects and features of the disclosure may advantageously be used separately in some instances, or in combination with other aspects and features of the disclosure in other instances. Accordingly, variations and modifications may be made to the memory systems, architectural structure and method of operation to achieve different effects.

The present disclosure generally provides improved methods and systems for detecting errors in processor memory load operations. Certain aspects of the disclosure provide a system that includes a computer processor comprising a plurality of registers, a load-store unit configured to load data in at least one of the plurality of registers, and a memory. The includes a memory location mapped to a first virtual memory address and a second virtual memory address, wherein issuance of a load from the memory location via the first virtual memory address causes execution of a side effect. The memory also include a computer program containing programming instructions that, when executed by the computer processor, performs an operation that comprises storing a predetermined data value at the memory location, and testing the memory for errors during load operations.

Optionally, testing the memory for errors during load operations comprises issuing load requests to the first virtual memory address and the second virtual memory address, identifying the memory location being mapped to the first virtual memory address and the second virtual memory address, causing the load store unit to load data from the memory location to a first register and a second register, and executing the side effect that causes the load store unit to store a modified data value at the memory location. Testing the memory for errors during load operations may also comprise determining whether a first data value loaded at the first register is equal to a second data value loaded at the second register, and determining that no load operation error occurred if the first data value loaded at the first register is equal to the second data value loaded at the second register. However, the system determines that a load operation error has occurred if the first data value loaded at the first register is not equal to the second data value loaded at the second register. Such load operation error is indicative of executing the load operation at the first virtual memory address more than once. The system may stop the execution of instructions by the processor if it is determined that a load operation error has occurred. Alternatively and/or additionally, identifying the memory location being mapped to the first virtual memory address and the second virtual memory address comprises performing address translation.

In an embodiment, the modified data value is indicative of a number of times a load operation was previously executed at the first virtual memory address. In a further embodiment, the storing step of the operation is performed before occurrence of a test triggering event and/or the testing step of the operation is performed after occurrence of a test triggering event. Optionally, test triggering event may be power on of the system, receipt of user instructions, and/or a periodic occurrence.

In yet another embodiment, the side-effect is executed by initializing a hardware module and/or as a sub-routine associated with the first virtual memory location.

In another aspect a method of detecting processor load errors comprises storing a predetermined data value at a memory location, initializing a side-effect that causes a load store unit of the processor to store a modified data value at the memory location upon execution of a load request at the memory location via a first virtual memory address, and testing the memory for errors during load operations. The testing may be performed by issuing load requests to the first virtual memory address and a second virtual memory address (wherein the memory location is mapped to the first virtual memory address and the second virtual memory address), identifying the memory location being mapped to the first virtual memory address and the second virtual memory address, loading data from the memory location to a first register and a second register, and executing the side effect to store the modified data value at the memory location.

BRIEF DESCRIPTION OF THE DRAWINGS

The various aspects, features and embodiments of processor, architectural structure, and its method of operation will be better understood when read in conjunction with the figures provided. Embodiments are provided in the figures for the purpose of illustrating aspects, features and/or various embodiments of the processor, architectural structure and method of operation, but the claims should not be limited to the precise arrangement, structures, features, aspects, embodiments or devices shown, and the arrangements, structures, subassemblies, features, aspects, embodiments, methods, and devices shown may be used singularly or in combination with other arrangements, structures, subassemblies, features, aspects, embodiments, methods and devices.

DETAILED DESCRIPTION

The following description is made for illustrating the general principles of the invention and is not meant to limit the inventive concepts claimed herein. In the following detailed description, numerous details are set forth in order to provide an understanding of a processor, its architectural structure, and its method of operation, however, it will be understood by those skilled in the art that different and numerous embodiments of the processor, architectural structure, and method of operation may be practiced without those specific details, and the claims and invention should not be limited to the embodiments, subassemblies, features, processes, methods, aspects, features or details specifically described and shown herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an" and "the" include plural referents unless otherwise specified.

The following discussion omits or only briefly describes conventional features of information processing systems, including processors and microprocessor systems and architecture, which are apparent to those skilled in the art. It is assumed that those skilled in the art are familiar with the general architecture of processors, and in particular, the load operations of a processor, including multi-slice processors and their use of execution units such as load store units (LSUs), registers, and load and store queues. It may be noted that a numbered element is numbered according to the figure in which the element is introduced, and is typically referred to by that number throughout succeeding figures.

Embodiments herein provide a test case module (whether physical or simulated) and/or logic for testing the validity of load operations performed by a processor for loading data from the main memory to a register. As will become more apparent below, the test may be performed at different levels of a memory hierarchy, e.g., at a component level, a system level, a device level, or a subsystem level. Furthermore, logic utilized to perform such testing can be resident to different extents in a number of components in a memory architecture, e.g., in a memory controller logic, memory system logic, a processor, and/or any intermediate logic there between.

Figure 1:
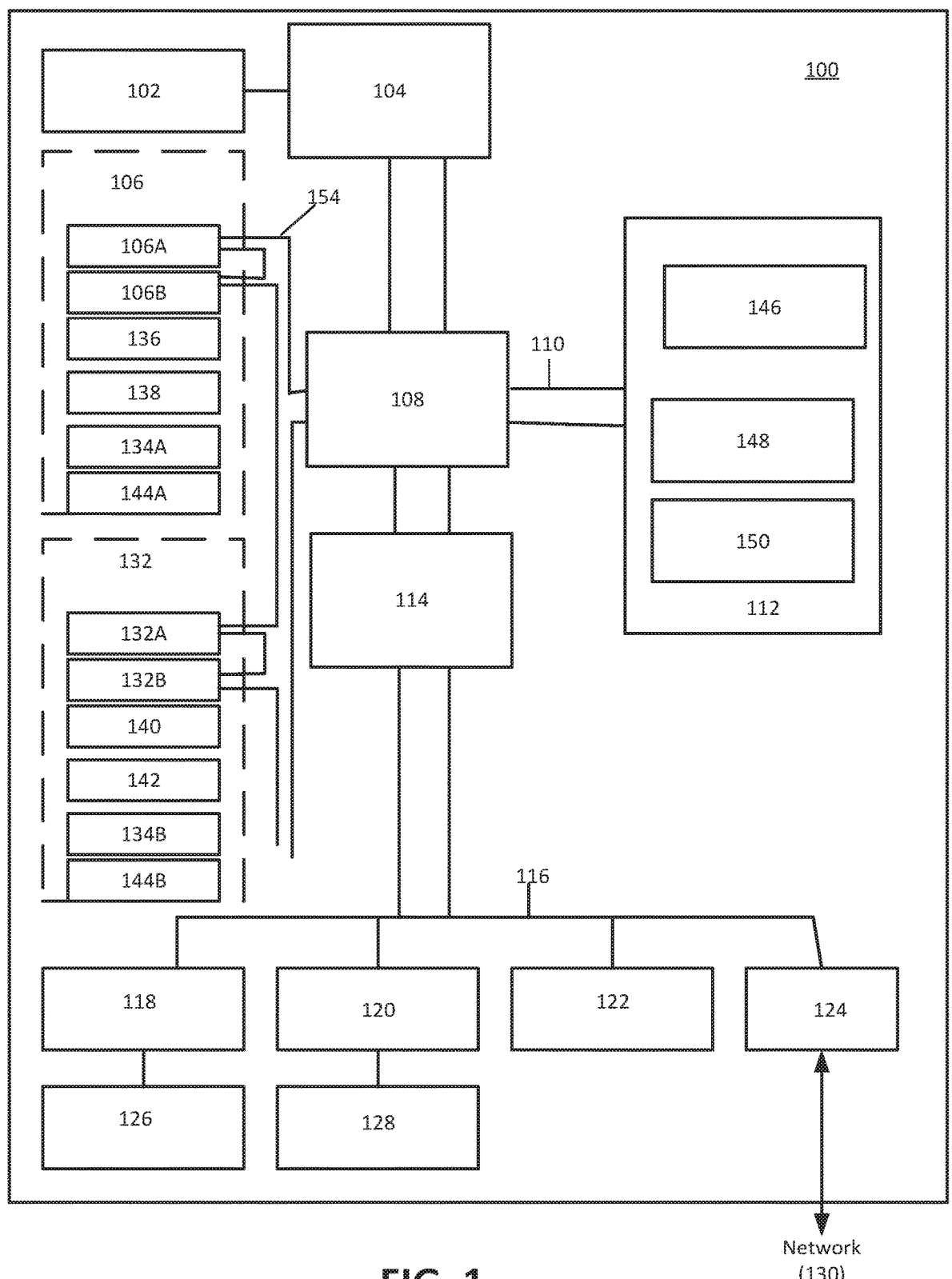
FIG. 1 depicts a general computing system in accordance with an embodiment.

FIG. 1 is a block diagram illustrating an example computing device, according to embodiments. The components of the computing device 100 can include one or more processors 106 and 132, a memory system 112, a terminal interface 118, a storage interface 120, an Input/Output ("I/O") device interface 122, and a network interface 124, all of which are communicatively coupled, directly or indirectly, for inter-component communication via a memory bus 110, a processor bus 154, an I/O bus 116, bus interface unit ("IF") 108, and an I/O bus interface unit 114.

The computing device 100 may include one or more general-purpose programmable central processing units (CPUs) 106A, 106B, 132A, and 132B, herein generically referred to as the processors 106 and 132. In some embodiments, each of the CPUs (106A, 106B, 132A, and 132B) may be individual processor cores. In an embodiment, the computing device 100 may contain multiple processors; however, in another embodiment, the computing device 100 may alternatively be a single CPU device. Each processor executes instructions stored in the memory system 112.

In some embodiments, each processor may include a memory management unit (MMU) that includes a TLB and a Segment Lookaside Buffer (SLB), both of which may be address translation caches. For example, processor 106 may include TLB 136 and SLB 138 and processor 132 may include TLB 140 and SLB 142. The SLBs may be utilized for mapping effective addresses to virtual addresses and the TLBs may be utilized for mapping virtual addresses to physical addresses such that address translation may occur, as described in more detail below.

The computing device 100 may include a bus interface unit 108 to handle communications among the processors 106 and 132, the memory system 112, the display system 104, and the I/O bus interface unit 114. The I/O bus interface unit 114 may be coupled with the I/O bus 116 for transferring data to and from the various I/O units. The I/O bus interface unit 114 may communicate with multiple I/O interface units 118, 120, 122, and 124, which are also known as I/O processors (IOPs) or I/O adapters (IOAs), through the I/O bus 116. The display system 104 may include a display controller, a display memory, or both. The display controller may provide video, audio, or both types of data to a display device 102. The display memory may be a dedicated memory for buffering video data. The display system 104 may be coupled with a display device 102, such as a standalone display screen, computer monitor, television, a tablet or handheld device display, or other displayable device. In an embodiment, the display device 102 may include one or more speakers for rendering audio. Alternatively, one or more speakers for rendering audio may be coupled with an I/O interface unit. In alternate embodiments, one or more functions provided by the display system 104 may be on board an integrated circuit that also includes the processor 106 and/or 132. In addition, one or more of the functions provided by the bus interface unit 108 may be on board an integrated circuit that also includes the processor 106 and/or 132.

The I/O interface units support communication with a variety of storage and I/O devices. For example, the terminal interface unit 118 supports the attachment of one or more user I/O devices, which may include user output devices (such as a video display devices, speaker, and/or television set) and user input devices (such as a keyboard, mouse, keypad, touchpad, trackball, buttons, light pen, or other pointing devices). A user may manipulate the user input devices using a user interface, in order to provide input data and commands to the user I/O device 126, and the computing device 100 may receive output data via the user output devices. For example, a user interface may be presented via the user I/O device 126, such as displayed on a display device, played via a speaker, or printed via a printer.

The storage interface 120 supports the attachment of one or more disk drives or direct access storage devices 128 (which are typically rotating magnetic disk drive storage devices, although they could alternatively be other storage devices, including arrays of disk drives configured to appear as a single large storage device to a host computer, or solid-state drives, such as a flash memory). In another embodiment, the storage device 128 may be implemented via any type of secondary storage device. The contents of data within the memory system 112, or any portion thereof, may be stored to and retrieved from the storage device 128 as needed. The I/O device interface 122 provides an interface to any of various other I/O devices or devices of other types, such as printers or fax machines. The network interface 124 provides one or more communication paths from the computing device 100 to other digital devices and computer systems.

Although the computing device 100 shown in FIG. 1 illustrates a particular bus structure providing a direct communication path among the processors 106, the memory system 112, the bus interface 108, the display system 104, and the I/O bus interface unit 114, in alternative embodiments the computing device 100 may include different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface unit 114 and the I/O bus 108 are shown as single respective units, the computing device 100, may include multiple I/O bus interface units 114 and/or multiple I/O buses 116. While multiple I/O interface units are shown, which separate the I/O bus 116 from various communication paths running to the various I/O devices, in other embodiments, some or all of the I/O devices are connected directly to one or more system I/O buses.

In various embodiments, the computing device 100 is a multi-user mainframe computer system, a single-user system, or a server computer or similar device that has little or no direct user interface, but receives requests from other computer systems (clients). In other embodiments, the computing device 100 may be implemented as a desktop computer, portable computer, laptop or notebook computer, tablet computer, pocket computer, telephone, smart phone, or any other suitable type of electronic device. In some embodiments, the computing device 100 is a Symmetric Multiprocessing System (SMP). An SMP may be a system that includes two or more processors (e.g., processors 106 and 132) that share a memory and an operating system instance. An SMP's processor may perform multiple processes simultaneously.

In an embodiment, the memory system 112 may include a random-access semiconductor memory, storage device, or storage medium (either volatile or non-volatile) for storing or encoding data and programs. In another embodiment, the memory system 112 represents the entire virtual memory of the computing device 100, and may also include the virtual memory of other computer systems coupled to the computing device 100 or connected via a network 130. The memory may be a single monolithic entity, but in other embodiments the memory system 112 may include a hierarchy of caches and other memory devices. For example, memory may exist in multiple levels of caches, and these caches may be further divided by function, so that one cache holds instructions while another holds non-instruction data, which is used by the processor. Memory system 112 may be further distributed and associated with different CPUs or sets of CPUs, as is known in any various so-called non-uniform memory access (NUMA) computer architectures. A processor can access specific locations in memory system 112 by placing the location's address onto an address bus. The contents in the specified location of memory system 112 are then accessed by the processor on a memory bus 110.

The memory system 112 comprises a volatile memory device in which an operating system, the test case module 146 and other programs are loaded. The test case module 146 may be a module that identifies whether there are any issues with the load operations from the memory system 112, as described in more detail below. In some embodiments, the test case module 146 may be a part of the computing device 100 operating system (not shown here). A "test case" as described herein may refer to a set of variables or conditions under which a tester (e.g., an operating system, a user, program module, etc.) may determine whether a system under the test satisfies requirements or works correctly. Test cases may include such information as preconditions, a set of input values, a set of expected results, how to execute and check results, and/or expected post conditions, or any other suitable information. The test case module in FIG. 1 may be utilized to test processing errors in issuing loads from the memory system to a register utilizing side-effects. The test case may be executed by, for example, the test case module 146, an operating system, or other modules. In an embodiment, one or more processors (106 and/or 132) of the computing device 100 may execute the test case module 146 by executing test case instructions on data (operands) that are provided from a register file 134A or 134B. Operand data is transferred to and from register file 134A or 134B through load and store operations, respectively. A load operation searches the memory system 112 for data at a specified memory address, and returns the data to register files 134A or 134B of processors 106 or 132. A store writes data from register files 134A and 134B to one or more levels of the memory system 112. The register file 134A and 134B may include a plurality of register file cells. The processors 106 and 132 also include load-store units (LSU) 144A and 144B for performing the load and/or store operations.

In some embodiments, the memory system 112 may include a test case module 146, a page table 148, and a segment table 150. A page table 148 (also known as a page map) is a data table structure stored in the memory system 112 that is utilized by a virtual memory system to store mappings of the low-order bits of virtual addresses to the low-order bits of physical addresses. A segment table 150 is a data table structure stored in the memory system 112 that is utilized by a virtual memory system to store mappings from the high-order bits of effective addresses to the high-order bits of virtual addresses.

The memory system 112 may store all or a portion of the components and data shown (e.g., test case module 146, page table 148, and segment table 150). These programs and data structures are illustrated in FIG. 1 as being included within the memory system 112 in the computing device 100; however, in other embodiments, some or all of them may be on different computer systems and may be accessed remotely, e.g., via a network 130. The computing device 100 may use virtual addressing mechanisms that allow the programs of the computing device 100 to behave as if they only have access to a large, single storage entity instead of access to multiple, smaller storage entities. Thus, while the components and data shown in FIG. 1 are illustrated as being included within the memory 112, these components and data are not necessarily all completely contained in the same storage device at the same time. Although the components and data shown in FIG. 1 are illustrated as being separate entities, in other embodiments some of them, portions of some of them, or all of them may be packaged together.

In an embodiment, the components and data shown in FIG. 1 may include instructions or statements that execute on the processors 106 and/or 132 or instructions or statements that are interpreted by instructions or statements that execute the processors 106 and/or 132 to carry out the functions as further described below. In another embodiment, the components shown in FIG. 1 may be implemented in hardware via semiconductor devices, chips, logical gates, circuits, circuit cards, and/or other physical hardware devices in lieu of, or in addition to, a processor-based system. In an embodiment, the components shown in FIG. 2 may include data in addition to instructions or statements.

In an embodiment, at least one memory location W in the memory system 112 is mapped to two virtual memory addresses (X and Y), and is configured to store a pre-defined data value "a". The memory location W may be any location in the hierarchy of memory system 112. The data value can include any now or hereafter known type or size of data. In an embodiment, one of the two virtual memory addresses (e.g., X) may be associated with side-effects such that when the system receives a load request to load data from X to a register, one or more side-effects are triggered. In an example embodiment, triggering of a side-effect may cause execution of a store operation such that a modified data value "a1" is stored at the memory location W (as discussed below). While the subsequent location describes memory location W being mapped to two virtual memory addresses (X and Y), the memory location may be mapped to any number of virtual memory addresses, but shall include at least the virtual address X that is associated with the one or more side-effects.

FIG. 1 is intended to depict representative components of the computing device 100. Individual components, however, may have greater complexity than represented in FIG. 1. In FIG. 1, components other than or in addition to those shown may be present, and the number, type, and configuration of such components may vary. Several particular examples of additional complexity or additional variations are disclosed herein; these are by way of example only and are not necessarily the only such variations. The various program components illustrated in FIG. 1 may be implemented, in various embodiments, in a number of different ways, including using various computer applications, routines, components, programs, objects, modules, data structures etc., which may be referred to herein as "software," "computer programs," or simply "programs."

Figure 2:
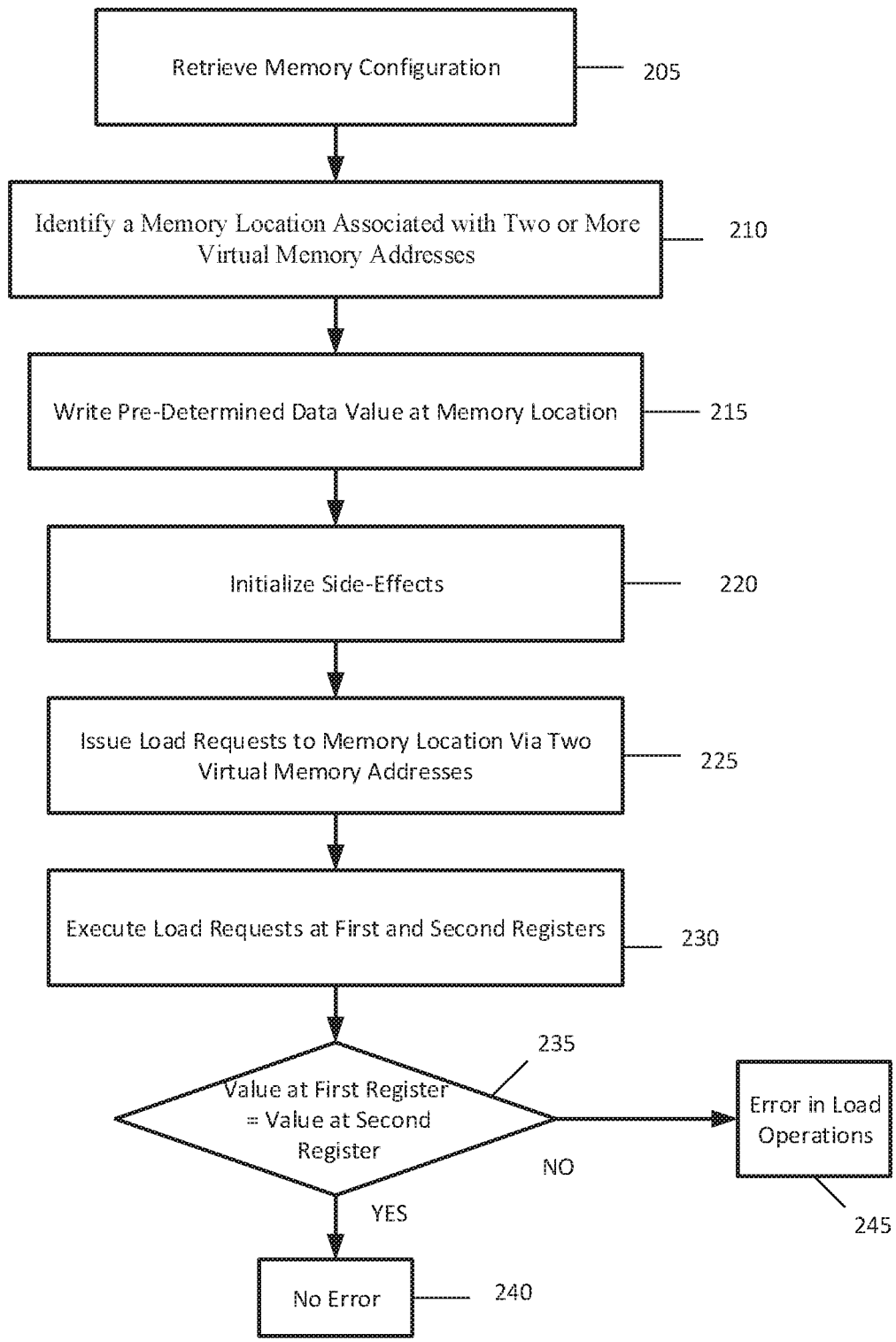
FIG. 2 depicts an example flowchart describing a method for detecting errors during processor memory load operations, according to an embodiment.

Referring now to FIG. 2, a flow chart depicting a process flow of a method 200 for testing processor errors in issuing loads from the memory system to a register of the register file is shown. The method 200 includes steps that may be executed by a processor core (e.g., a CPU of processors 106 and/or 132) of the system depicted in FIG. 1 before and/or after the test case module is triggered. Steps 205-220 are performed before triggering of the test case module (example, upon power on), and steps 225-245 may be performed after triggering of the test case module. The pre test case module triggering steps need not be performed immediately before the post test case module triggering steps. The test module may be triggered upon power on, periodically, or upon user instruction.

At 205, the system may retrieve the memory configuration of a memory system to be tested (from, for example, a memory controller), and may select a memory region to test. In an embodiment, the memory configuration may include data representing various memory regions in the memory systems (e.g., caches, main memory, etc.), the addresses, the virtual memory mapping, etc. of the memory system.

At 210, for the memory region to be tested, the system may identify at least one memory location W that is associated with two or more virtual memory addresses (X and Y). The system may identify the memory location W using address translation based on the memory configuration received. Alternatively and/or additionally, the system may select a memory location in the memory region to be tested and create a memory mapping to associate the memory location with at least two virtual memory addresses. The system may test any number of locations and/or sizes within the memory region using the principles disclosed herein.

At 215, the system may write or store a pre-determined data value "a" to the selected memory location W. It should be noted that once a memory location W has been initialized by writing or storing a pre-determined data value "a", that memory location is only used for testing purposes for detecting errors during load operations. As discussed above, the system may test any number of locations and/or sizes within the memory region using the principles disclosed herein. For example, the system may initialize all the memory locations to be tested with known data values and perform the testing as described below.

Next, the system may initialize side-effects for testing of load issue errors (220). In one embodiment, the system may initialize the side-effects by associating a sub-routine with one of the virtual memory addresses (hereinafter "X") associated with the selected memory location (220). The sub-routine may be for example, a callback function, a handler (such as an interrupt handler), or the like. In an embodiment, the sub-routine may be invoked as a side-effect of loading the data value "a" from the memory location W to a register by issuing the load request to virtual memory address (X). Specifically, loading the data value "a" from the selected memory location W to a register by issuing the load request to virtual memory address (X) causes the sub-routine to issue a store request that stores a modified data value "a1" at the selected memory location W. In an embodiment, the modified data value "a1" may be a fixed counter value added to the original data value "a" and may be indicative of the number of times data is loaded from memory location W by issuing a load request to memory address (X). For example, the modified data value may be a constant value added to the data value at the memory location every time data is loaded via virtual memory address X.

Alternatively and/or additionally, the system may initialize the side-effects by initializing a hardware module of the system that may automatically detect when a load occurs from virtual memory address (X) and execute the side-effect itself without executing a sub-routine. In an embodiment, the hardware module may analyze specific bits in, for example, an effective address to which a load request has been issued in order to determine whether it should execute a side-effect. For example, an effective address 0x00 may indicate that no side effect should be executed, and an effective address 0x10 may indicate that a side effect should be executed, where both addresses translate to virtual memory addresses corresponding to the same real location in memory. Specifically, bit 4 numbering from zero at the right of an effective address may include an indication for the hardware module regarding whether or not it should execute a side effect.

At 225, the system may initiate the testing of load issue errors by issuing load requests to the memory location (W) via at least two virtual memory addresses associated with the memory location (W), one of which is virtual memory address (X). For example, if the memory location is associated with virtual memory addresses X and Y, the system may issue the following instructions:
Load x=[X], and
Load y=[Y].

Figure 3:
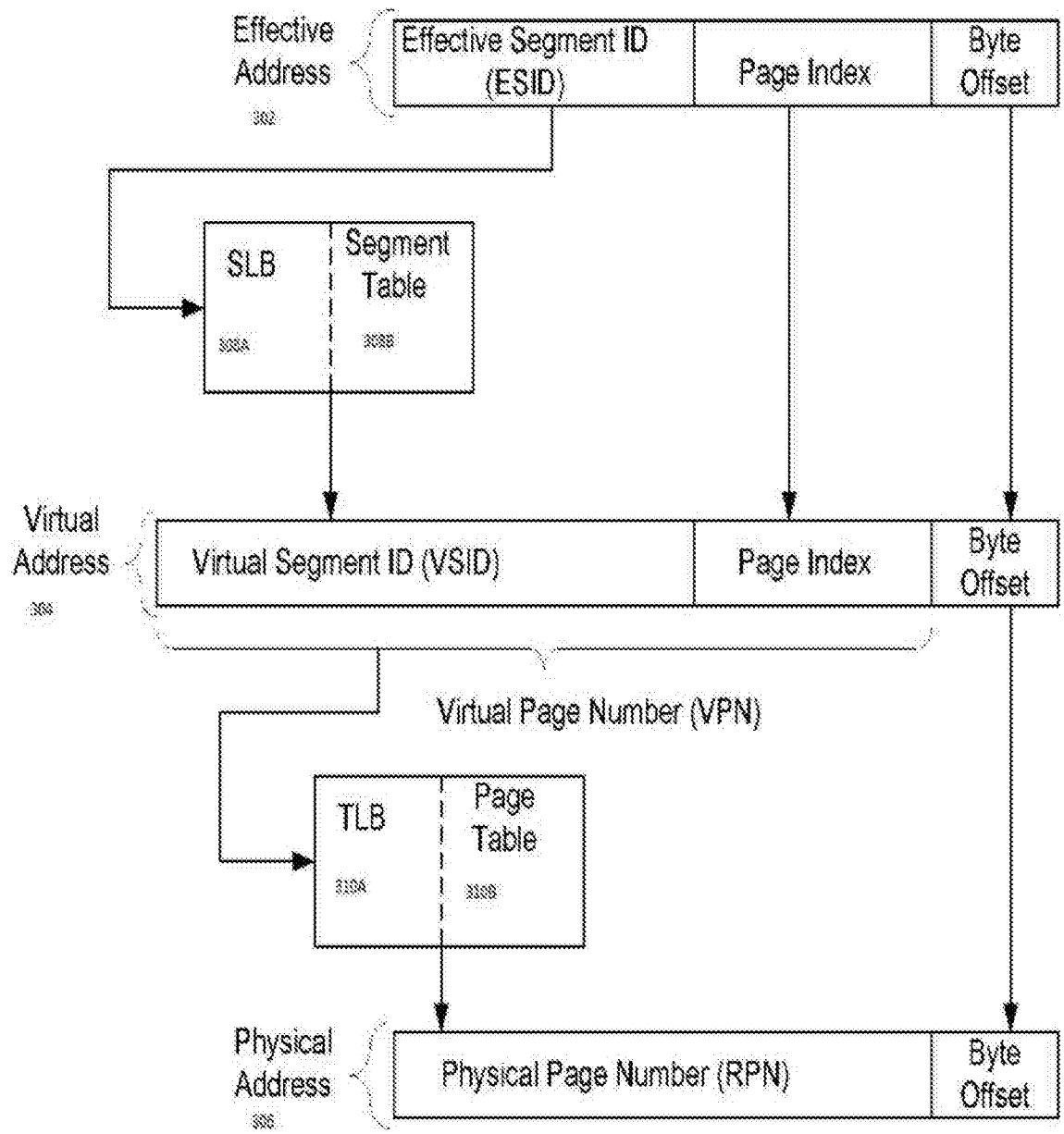
FIG. 3 is an example diagram illustrating how addresses are translated in a virtual memory system, according to embodiment.

The system may identify the memory location associated with the memory addresses X and Y using address translation. FIG. 3 illustrates an example diagram illustrating how addresses are translated in a virtual memory system, according to embodiments. FIG. 3 includes an effective address 302 (that comprises an Effective Segment ID (ESID), a page index, and byte offset), an SLB 308A, a segment table 308B, a virtual address 304 (that comprises a virtual segment ID (VSID), page index, and byte offset), a TLB 310A, a page table 310B, and a physical address 306 (that includes a physical page number (also referred to herein as a real page number or RPN) and a byte offset).

In some embodiments, address translation in FIG. 3 may start when a request for data within memory is made. A program may first reference memory using the effective (logical) address 302 (e.g., 64 bits) computed by a system when it executes a load, store, branch or cache instruction, etc. Each process may include its own unique effective address space. This allows every process to run as though it is the only process running on the system and has all required memory resources available. In order to translate the effective address 302 to the virtual address 304, the operating system or other component may perform a table lookup within the SLB 308A and, if needed, the segment table 308B. The SLB 308A and/or segment table 308B within main memory may include at least two fields—an ESID field and VSID field. Accordingly, the operating system or other component may translate the effective address 302 to the virtual address 304 by first searching within the SLB for the ESID. If the particular ESID is within the SLB (a hit), then the ESID indicates the mapped or corresponding VSID. If the ESID is not within the SLB (a miss), then the operating system or other component may search the main memory within the segment table 308B for the ESID. If the ESID is within the segment table (a hit), then the ESID indicates the mapped VSID. If the ESID is not within the SLB 308A or segment table 308B (a miss), the ESID in some cases may be paged into main memory from a storage device (e.g., disk) and the main memory segment table (and SLB) may accordingly be updated.

If the ESID is found within the SLB 308A or segment table 308B, then the virtual address 304 may be obtained. A virtual address may be an intermediate address that is generated by the processor or processor core (or hypervisor) during the address translation process by concatenating a VSID, a page index, and a byte offset. As discussed above, the VSID may be obtained from the SLB 308A or segment table 308B. The page index of the virtual address 304 may be obtained from the page index of the effective address 302. Likewise, the byte offset of the virtual address 304 may be obtained from the byte offset of the effective address 302. The byte offset in FIG. 3 may indicate where a location is within a particular page.

The VSID and page index, in some embodiments, comprise the virtual page number (VPN). In order for the virtual address 304 to be translated to the physical address 306, a hypervisor or other component may search for a particular VPN within the TLB 310A, and, if not found in the TLB 310A, the page table 310B. The TLB 310A and page table 310B may both include at least two fields (not shown in FIG. 3). A first field may include the VPN and a second field may include a corresponding RPN. Accordingly, if the VPN of the virtual address 304 is located (a hit), then its corresponding RPN may be located. In some embodiments, the hypervisor or other component may first search the TLB 310A for the VPN. If the VPN is not within the TLB 310A (a miss), then the hypervisor or other component may search within the page table 310B. If the VPN is not within the page table 310B (miss), then a page fault may occur and the page corresponding with the VPN may be loaded into main memory (RAM) from a hard drive or non-volatile memory and the memory page table may be updated with the VPN and corresponding RPN.

If the VPN is found within the TLB 310A or page table 310B, then the physical address 306 may be obtained. A physical address may be a final address that is generated by the processor or processor core (or hypervisor) during the address translation process. As discussed above, the VSID may be obtained from the SLB 308A or segment table 308B. The page index of the physical address 306 may be obtained from the page index of the virtual address 304. Likewise, the byte offset of the physical address 306 may be obtained from the byte offset of the virtual address 304. After the physical address 306 is obtained, it may be transmitted to a memory subsystem and may be utilized to access memory and devices (e.g., Peripheral Component Interconnect Express (PCIE) devices). A physical address may correspond to some physical resource in the system, such as an address in the memory system 112 (Random Access Memory (RAM), DRAM, or the like). In an embodiment, a plurality of virtual addresses may be linked to the same physical address.

Upon identification of the memory location associated with memory addresses X and Y, the system may execute (230) the load requests. Upon execution of the above load requests, the data value stored at memory location W will be stored in registers x and y. Furthermore, as a side-effect of the instruction of loading the data value from the memory location W to register x via the virtual memory address (X), a modified data value is stored at the memory location W.

At 235, the system may compare the data values loaded at registers x and y to determine if the data value at x is equal to the data value at y. If the data value at x is equal to the data value at y (235: YES), the system determines that the load operations are being executed without any errors (240). However, if the data value at x is not equal to the data value at y (235: NO), the system determines that the load operations are being executed with errors (245). If the data value at x is not equal to the data value at y, it implies that a modified data value was loaded at x and that the load operation from memory location W to x has been performed at least once before in error. For example, if the processor is issuing loads with errors, it may attempt to issue a load from location X twice—the first load issue stores the original data value at x and the second load issue stores the modified data value at x (since the first load operation lead to the execution of the side-effect), thereby changing the final value stored at x.

It should be noted that the system first executes the load request from location Y and then only executes the load request from location X in order to prevent changing the value loaded from location Y because of a load issue error from location X.

Upon detecting an error, the system may stop execution of any further instructions by the processor that includes the register.

Figure 4:
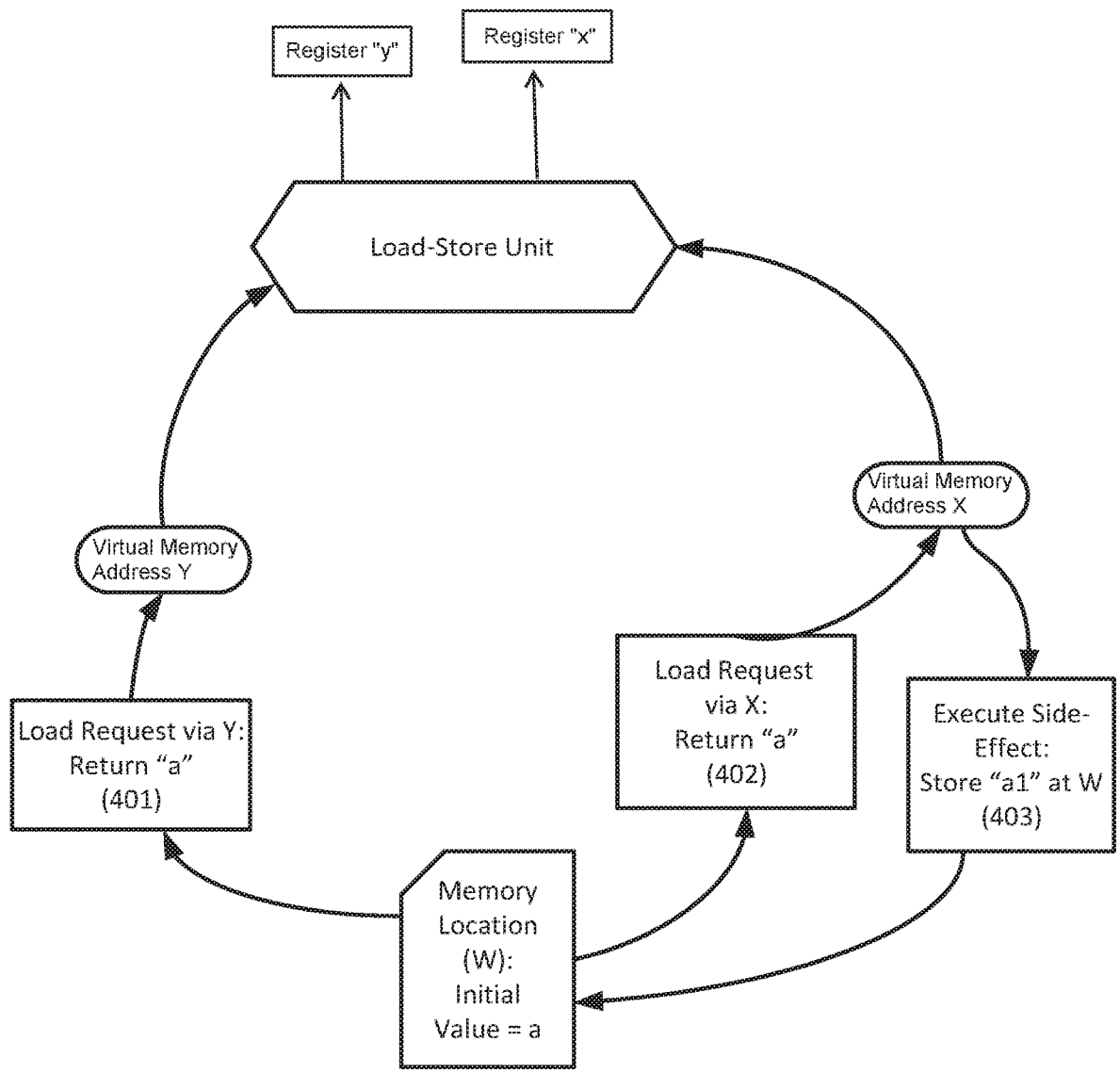
FIG. 4 depicts a flowchart illustrating the execution of a side-effect accordance with an embodiment.

A flowchart diagram illustrating the execution of the side-effect is shown in FIG. 4. As shown in FIG. 4, loads are issued from memory location W to registers y and x via virtual memory addresses Y and X, respectively, and an initial data value "a" is stored at memory location W. Upon issuance of the load from memory location W to register y, via memory address Y (401), there is no side-effect during the load issue operation and the data value "a" at W remains unchanged. Subsequently, upon issuance of the load from memory location W to register x, via virtual memory address X (402), a side-effect is executed (403) that leads to storage of a modified data value "a1" at the memory location W. If the system executes another load issue from W, the modified data value "a1" will be provided. Hence, errors that include issuance of load via memory address X at the same memory location more than once may be detected.

It should be noted that while the above description describes detecting errors during load operations between the main memory and the registers of a processor, similar principles may used for detecting load operation errors in a Memory Mapped Input Output (MMIO), interfacing to an I/O device. An MIMIO component within the processor processes load/store operations to virtual memory addresses that map to local memory or to device memory addresses by generating an I/O bus transaction to transfer the data directed to and/or from a virtual address to the corresponding location in the device memory.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:
a computer processor comprising a plurality of registers;
a load-store unit configured to load data in at least one of the plurality of registers;
and a memory comprising:
a memory location mapped to a first virtual memory address and a second virtual memory address, wherein issuance of a load request from the memory location via the first virtual memory address causes execution of a side effect that causes the load-store unit to store a modified data value at the memory location, and
a computer program containing programming instructions that, when executed by the computer processor, performs an operation, the operation comprising:
storing a predetermined data value at the memory location, and
testing the memory for errors during load operations.

2. The system of claim 1, wherein testing the memory for errors during load operations comprises:
issuing load requests to the first virtual memory address and the second virtual memory address;
identifying the memory location being mapped to the first virtual memory address and the second virtual memory address;
causing the load store unit to load data from the memory location to a first register and a second register; and
executing the side effect that causes the load store unit to store a modified data value at the memory location.

3. The system of claim 2, wherein testing the memory for errors during load operations further comprises:
determining whether a first data value loaded at the first register is equal to a second data value loaded at the second register; and in response to determining that the first data value loaded at the first register is equal to the second data value loaded at the second register, determining that no load operation error occurred.

4. The system of claim 2, wherein testing the memory for errors during load operations further comprises:
in response to determining that the first data value loaded at the first register is not equal to the second data value loaded at the second register, determining that a load operation error has occurred, wherein the load operation error is indicative of executing the load operation at the first virtual memory address more than once.

5. The system of claim 4, further comprising stopping the execution of instructions by the processor.

6. The system of claim 2, wherein identifying the memory location being mapped to the first virtual memory address and the second virtual memory address comprises performing address translation.

7. The system of claim 1, wherein the modified data value is indicative of a number of times a load operation was previously executed at the first virtual memory address.

8. The system of claim 1, wherein the storing step of the operation is performed before occurrence of a test triggering event.

9. The system of claim 1, wherein the testing step of the operation is performed after occurrence of a test triggering event.

10. The system of claim 9, wherein the test triggering event is selected from at least one of a group consisting of power on of the system, periodically, receipt of user instructions, and combinations thereof.

11. The system of claim 1, wherein the side-effect is executed by initializing a hardware module.

12. The system of claim 1, wherein the side-effect is executed as a sub-routine associated with the first virtual memory location.

13. A method comprising, by a processor:
storing a predetermined data value at a memory location, wherein the memory location is mapped to a first virtual memory address and a second virtual memory address;
initializing a side-effect that causes a load store unit of the processor to store a modified data value at the memory location upon execution of a load request at the memory location via the first virtual memory address; and
testing the memory for errors during load operations by:
issuing load requests to the first virtual memory address and the second virtual memory address, wherein the memory location is mapped to the first virtual memory address and the second virtual memory address,
identifying the memory location being mapped to the first virtual memory address and the second virtual memory address,
loading data from the memory location to a first register and a second register, and
executing the side effect to store the modified data value at the memory location.

14. The method of claim 13, wherein testing the memory for errors during load operations further comprises:
determining whether a first data value loaded at the first register is equal to a second data value loaded at the second register; and
in response to determining that the first data value loaded at the first register is equal to the second data value loaded at the second register, determining that no load operation error occurred.

15. The method of claim 13, wherein testing the memory for errors during load operations further comprises:
In response to determining that the first data value loaded at the first register is not equal to the second data value loaded at the second register, determining that a load operation error has occurred, wherein the load operation error is indicative of executing the load operation at the first virtual memory address more than once.

16. The method of claim 15, further comprising stopping the execution of instructions by the processor.

17. The method of claim 13, wherein identifying the memory location being mapped to the first virtual memory addresses and the second virtual memory address comprises performing address translation.

18. The method of claim 13, wherein the modified data value is indicative of a number of times a load operation was previously executed at the first virtual memory address.

19. The method of claim 13, wherein the storing step is performed before occurrence of a test triggering event.

20. The method of claim 13, wherein the testing step is performed after occurrence of a test triggering event.

* * * * *